(12) United States Patent
Zhang et al.

(10) Patent No.: US 7,347,722 B2
(45) Date of Patent: Mar. 25, 2008

(54) METER SOCKET ASSEMBLY

(75) Inventors: Fan Zhang, Suwanee, GA (US); Kenneth Rogers, Grayson, GA (US); Roland Montalbo, Cumming, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 11/532,717

(22) Filed: Sep. 18, 2006

(65) Prior Publication Data

US 2007/0066131 A1 Mar. 22, 2007

Related U.S. Application Data

(60) Provisional application No. 60/717,802, filed on Sep. 16, 2005.

(51) Int. Cl.
*H01R 33/945* (2006.01)

(52) U.S. Cl. .................. 439/517; 439/839; 439/858

(58) Field of Classification Search ............. 439/517, 439/839, 856, 857, 858; 361/666, 668, 670
See application file for complete search history.

(56) References Cited

U.S. PATENT DOCUMENTS

| | | | | |
|---|---|---|---|---|
| 2,218,650 A | * | 10/1940 | Larson | 439/263 |
| 2,626,309 A | * | 1/1953 | Road et al. | 361/670 |
| 3,659,243 A | * | 4/1972 | Gluntz | 439/525 |
| 3,714,615 A | | 1/1973 | Coley | |
| 3,764,956 A | * | 10/1973 | Norden | 439/259 |
| 3,783,343 A | * | 1/1974 | Byland | 361/666 |
| 4,201,439 A | | 5/1980 | M'Sadoques | |
| 4,944,692 A | | 7/1990 | Allina | |
| 5,334,057 A | | 8/1994 | Blackwell | |
| 5,980,311 A | | 11/1999 | Campbell et al. | |
| 5,997,347 A | * | 12/1999 | Robinson et al. | 439/517 |
| 6,104,586 A | * | 8/2000 | Robinson | 361/102 |
| 6,428,350 B1 | | 8/2002 | Robinson et al. | |
| 6,921,290 B1 | | 7/2005 | Kellerman | |
| 7,018,247 B1 | | 3/2006 | Ranta et al. | |
| 7,040,921 B2 | | 5/2006 | Kellerman | |
| 7,106,576 B2 | * | 9/2006 | Schoonover et al. | 361/668 |

* cited by examiner

*Primary Examiner*—Neil Abrams

(57) ABSTRACT

A meter socket assembly comprising a meter jaw assembly and an extended bus bar for contact with a meter blade of a watt hour meter. The meter jaw assembly further comprises a meter jaw and a jaw spring guide that are mounted together by a fastening device to the extended bus bar. The extended bus bar comprises a chamfered terminal end and cutout portion to easily accept the meter blade. The jaw spring guide overlies the meter jaw and applies a bias force inward to urge the contact face of the meter jaw toward the extended bus bar closing any insertion space and guaranteeing tight contact with the meter blade. A meter socket guide snaps on to the bus bar to maintain the alignment of meter jaw with watt-hour meter blade.

26 Claims, 9 Drawing Sheets

METER SOCKET ASSEMBLY

CROSS REFERENCE OF RELATED APPLICATION

This application claims priority to and incorporates by reference herein in its entirety, pending U.S. Provisional Patent Application Ser. No. 60/717,802 filed on Sep. 16, 2005.

FIELD OF INVENTION

This invention relates to a meter socket assembly having a meter jaw for use with a watt-hour meter, and more particularly using a bus bar to directly contact a meter blade and limit heat rise generated by the connectors of the meter socket assembly.

BACKGROUND

Socket type electrical watt-hour meters are used to measure and indicate the amount of electrical power consumption in a residence, industry or business. Typically, a socket type watt-hour meter plugs into a meter socket using a blade-like stab or meter blade connector located on the watt-hour meter. The meter socket itself is mounted inside a meter base or a panel. A meter socket commonly has a spring loaded receptacle-like jaw to receive and contact the watt-hour meter blade insertion. The meter jaw and spring provide enough force to press meter blade and conduct electricity while maintaining a certain current load and a heat rise. One disadvantage of the current meter socket is that the spring bias force may exceed the industry standard limit for the force required to insert and extract the watt-hour meter. Another disadvantage of the current meter socket is that the spring does not provide consistent pressure over time for a reliable connection between the meter jaw and watt-hour meter blade.

The meter socket for a plug-in type watt-hour meter commonly uses "U" shaped one-piece or two piece jaw with return wrap receiving contacts. A disadvantage of the one-piece jaw, is that its shape limits the thickness of material used and more importantly, the one-piece jaw provides a long electrical current path by not directly contacting the meter blade and the bus bar. Similarly, there is a large amount of heat generated at the point of conduction in both the one piece and two piece jaws where such heat rise may cause meter malfunction if not properly dissipated.

Another disadvantage of the known meter socket is the difficulty in aligning both the one piece and the two piece jaws in both the vertical and horizontal direction with the meter blade.

Therefore there is a need for improvement in meter socket assemblies and in particular meter jaw assemblies.

SUMMARY OF INVENTION

In accordance with this invention, a meter socket assembly for an electrical meter box comprising: a meter jaw assembly for securing and contacting a meter blade of a watt hour meter to an extended bus bar; and a fastening device for mounting the meter jaw assembly to the extended bus bar.

In accordance with another aspect of this invention, a meter jaw assembly comprising: a meter jaw for contacting and securing a meter blade of a watt hour meter to an extended bus bar; and a spring jaw guide overlying the meter jaw.

In accordance with a further aspect of this invention, a meter socket enclosure assembly comprising: a housing comprising a plurality of walls wherein a front wall includes an opening for mounting a watt hour meter; and an inner surface of a back wall of the housing containing a plurality of a meter socket assemblies for mounting the watt hour meter.

In accordance with another aspect of this invention, a method to limit heat rise in a meter socket assembly of an electrical meter box comprising the steps of: providing an extended bus bar; providing a meter jaw assembly; and contacting a meter blade of a watt hour meter with an extended bus bar and a meter jaw assembly therebetween.

It is a primary object of this invention to provide a meter jaw assembly with a direct contact bus bar.

It is a further object of this invention to provide a meter jaw that will guarantee electrical connection even if there is misalignment between the meter jaw and the meter blade.

It is further object of this invention to provide a jaw spring guide with side arm guides to hold a meter blade in position and help guide the meter blade vertically into the meter socket and maximize contact of the meter blade between the bus bar and meter jaw.

It is a further object of this invention to provide a dual purpose bus bar, one that conducts electricity and also simultaneously transfers heat.

It is a further object of this invention to provide a jaw spring guide that overlays a meter jaw in order to provide reinforcement and press the meter blade for full contact with both the meter jaw and the bus bar.

DETAILED DESCRIPTION

Figure 1:
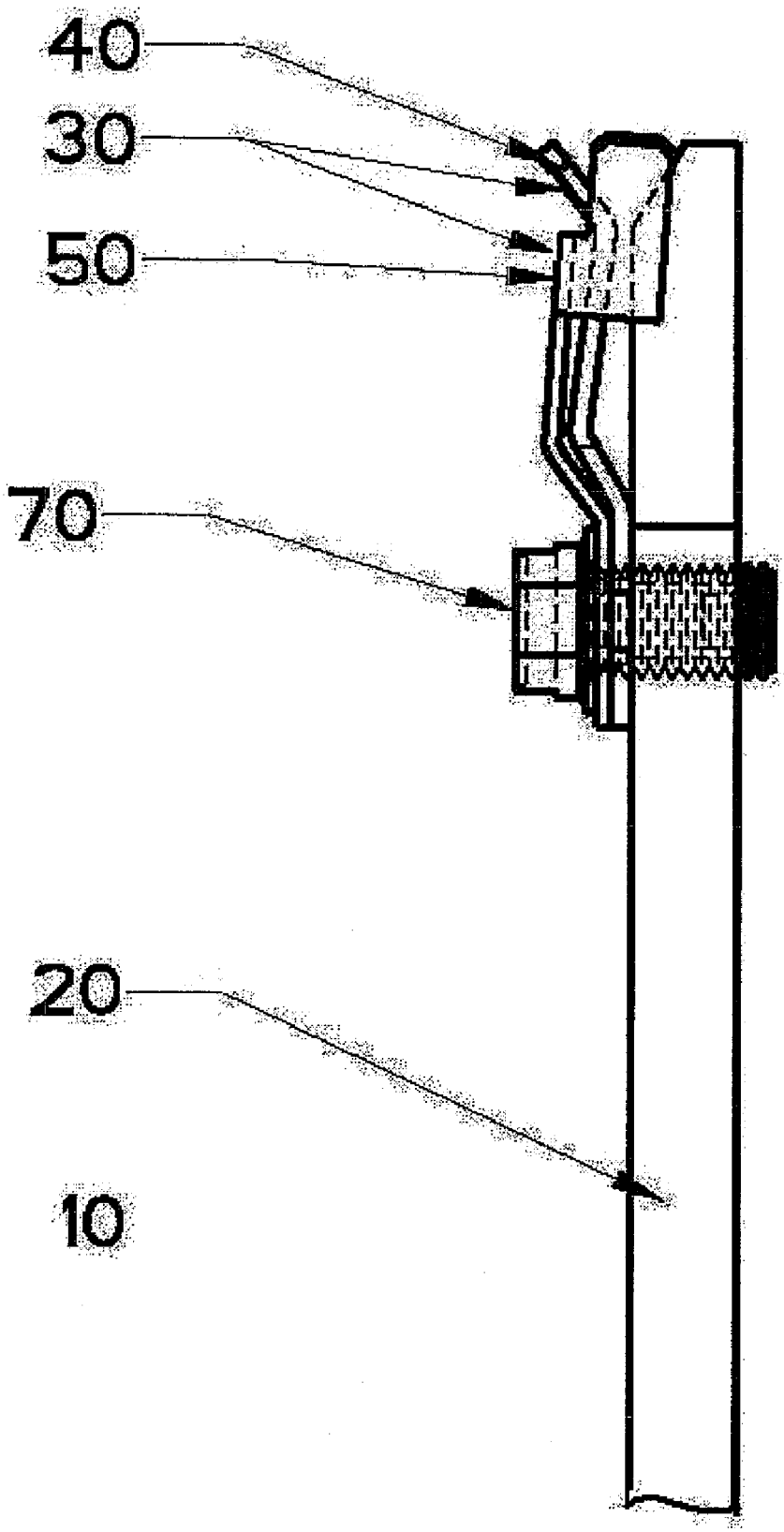
FIG. 1 is a side view of a meter socket assembly.

Referring to FIG. 1, meter socket assembly 10 includes an extended bus bar 20 and a meter jaw assembly 30. Meter jaw assembly 30 comprises a meter jaw 40 and jaw spring guide 50 that overlies meter jaw 40. The extended bus bar 20 features a chamfered receptacle terminal 60 (see FIG. 2) that is coupled with meter jaw 40. Chamfered receptacle terminal 60 creates a "V" shaped receptacle terminal with the upper portion of meter jaw 40 for easily inserting a meter blade (not shown) from a watt hour meter into the meter socket assembly 10. The upper portion of the meter jaw 40 has an outward bend away from the chamfered receptacle terminal 60. The middle portion of the meter jaw 40 has an outward joggle bend which then leans inward towards the extended bus bar 20. The outward joggle bend shape helps meter jaw 40 fully contact the meter blade under load and also provides a bias spring force to press the meter blade to extended bus bar 20. Extended bus bar 20 acts not only as a conductor to transmit electricity but also as a heat sink to quickly transfer away the heat generated during conduction. Jaw spring guide 50 provides the necessary bias spring force to reinforce and support meter jaw 40 so that meter jaw 40 and extended bus bar 20 hold the meter blade and allow extended bus bar 20 to maintain full contact with the meter blade during the watt hour meter's life time. The extended bus bar 20, and meter jaw assembly 30 are mounted together with a fastening device 70. In the preferred embodiment, the fastening device 70 is a screw. Others skilled in the art may select the fastening device 70 to be a clip, clamp, or a rivet element.

Figure 2:
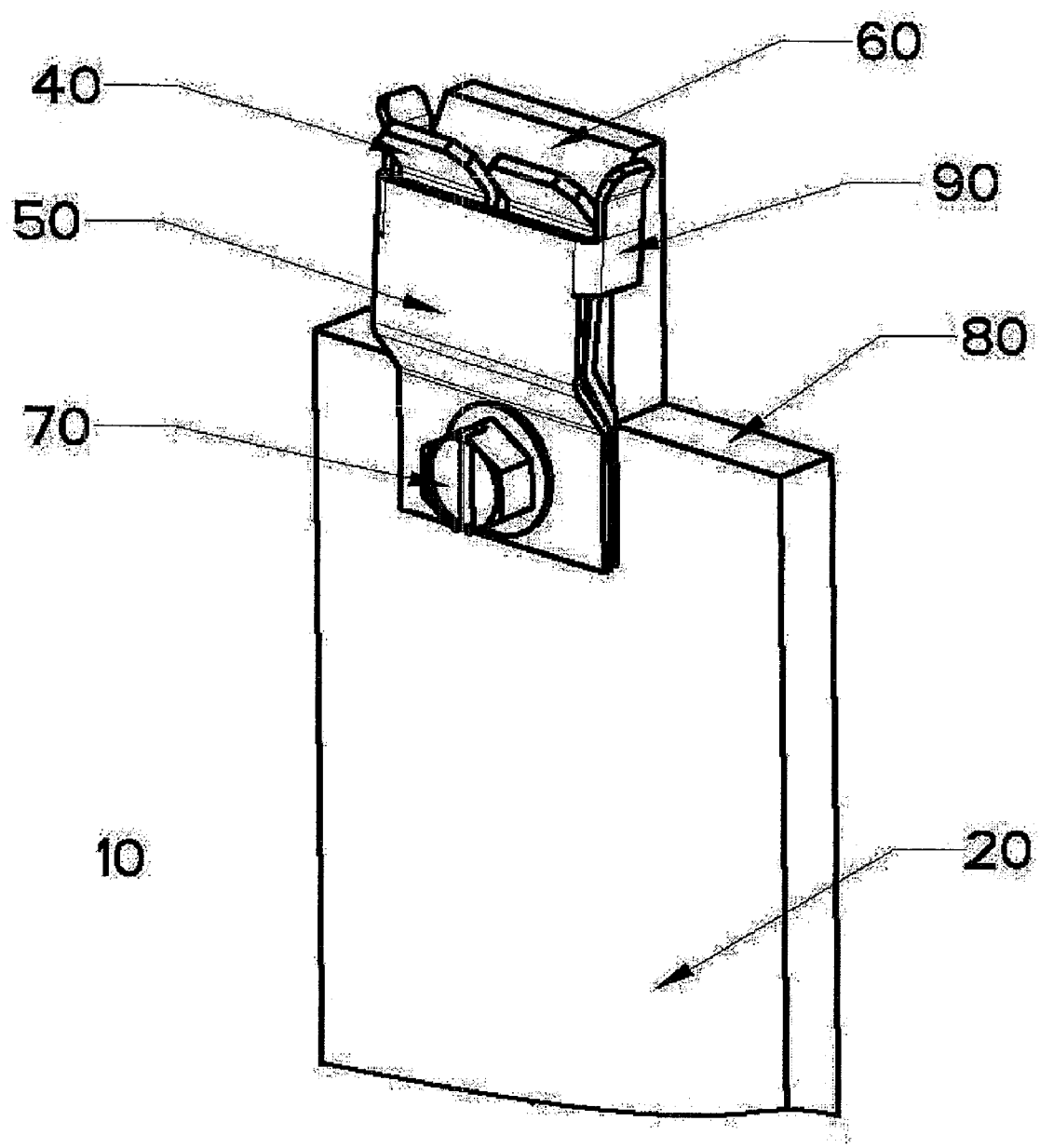
FIG. 2 is a perspective view of a meter socket assembly.

Referring to FIG. 2, meter socket assembly 10 comprises at least one cut out portion 80 on the top side of extended bus bar 20. The cut out portion 80 allows space for housing the meter feet of the watt-hour meter upon attachment to the meter socket assembly 10. The cut out portion 80 will be sized to specification and industry standard. Jaw spring guide 50 includes at least one arm guide 90 which leads and locates the meter blade into full contact position once the watt-hour meter is attached to the meter socket assembly 10. Arm guide 90 acts as a locating guide for locating and securing the meter blade of the watt hour meter. Arm guide 90 also acts an anti rotation mechanism for the meter blade while being inserted into the meter socket assembly 10. Arm guide 90 integrally extends from the main body portion of jaw spring guide 50. Others skilled in the art may select to not include an arm guide 90 for the jaw spring guide 50 and others skilled in the art may select to use more than one arm guide 90.

Figure 3:
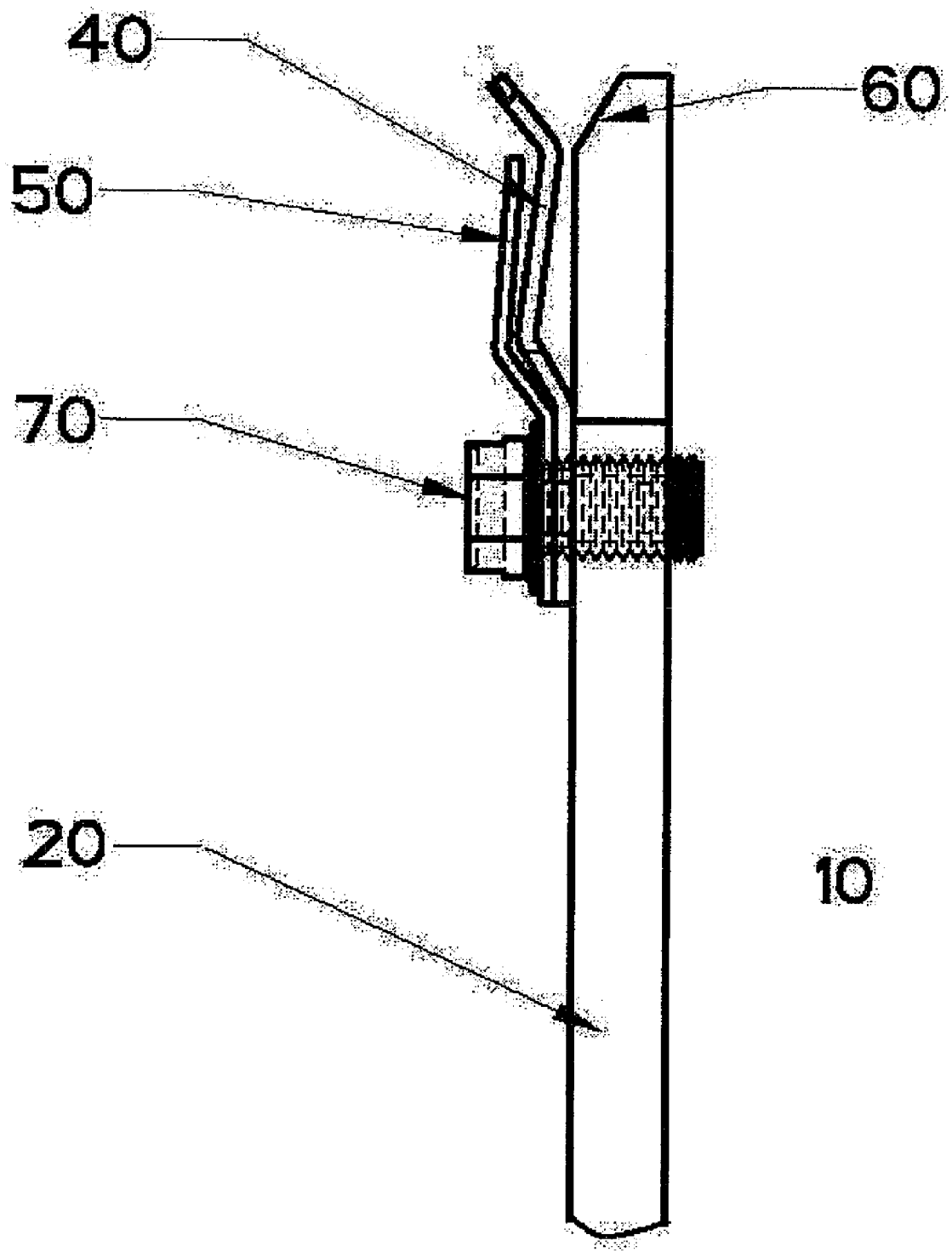
FIG. 3 is a side view of an alternate meter socket assembly.

Referring to FIG. 3, meter socket assembly 10 includes a jaw spring guide 50 without an arm guide 90 for a ringless-type application. In this embodiment, the jaw spring guide 50 is designed to leave an insertion space between the upper portion of meter jaw 40 and extended bus bar 20 when meter jaw 40 is in an open (no meter blade inserted) state. The insertion space is designed to maintain insertion and extraction forces over the meter blade of approximately 100 lbs to ensure that the bias spring force stays within the industry standard limits for watt hour meter insertion and extraction once the meter blade is inserted and pressed against the meter jaw 40. The insertion space between meter jaw 40 and extended bus bar 20 facilitates of insertion and extraction of watt-hour meter blades.

Figure 4:
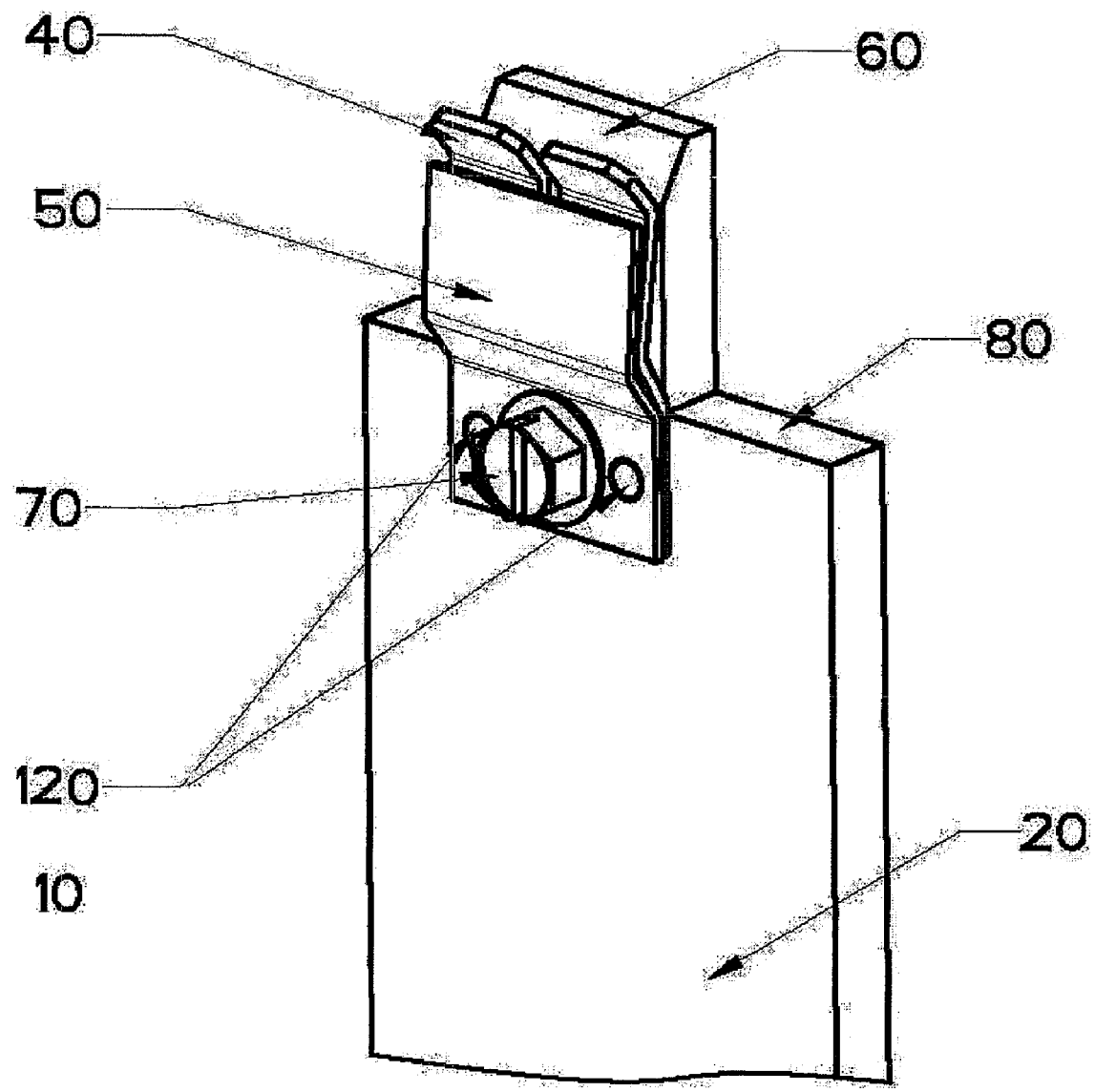
FIG. 4 is a perspective view of an alternate meter socket assembly.

Referring to FIG. 4, jaw spring guide 50 includes at least one locating feature 120 to locate the jaw spring guide 50 to the meter jaw 40 and extended bus bar 20. Locating feature 120 will mate with shear guide 110 (show in FIG. 5). Others skilled in the art may select not to use locating feature 120 and shear guide 110. Others skilled in the art may also include at least one locating feature 120 in the meter jaw 40 (see FIG. 5) and not include the at least one locating feature 120 in jaw spring guide 50.

Figure 5:
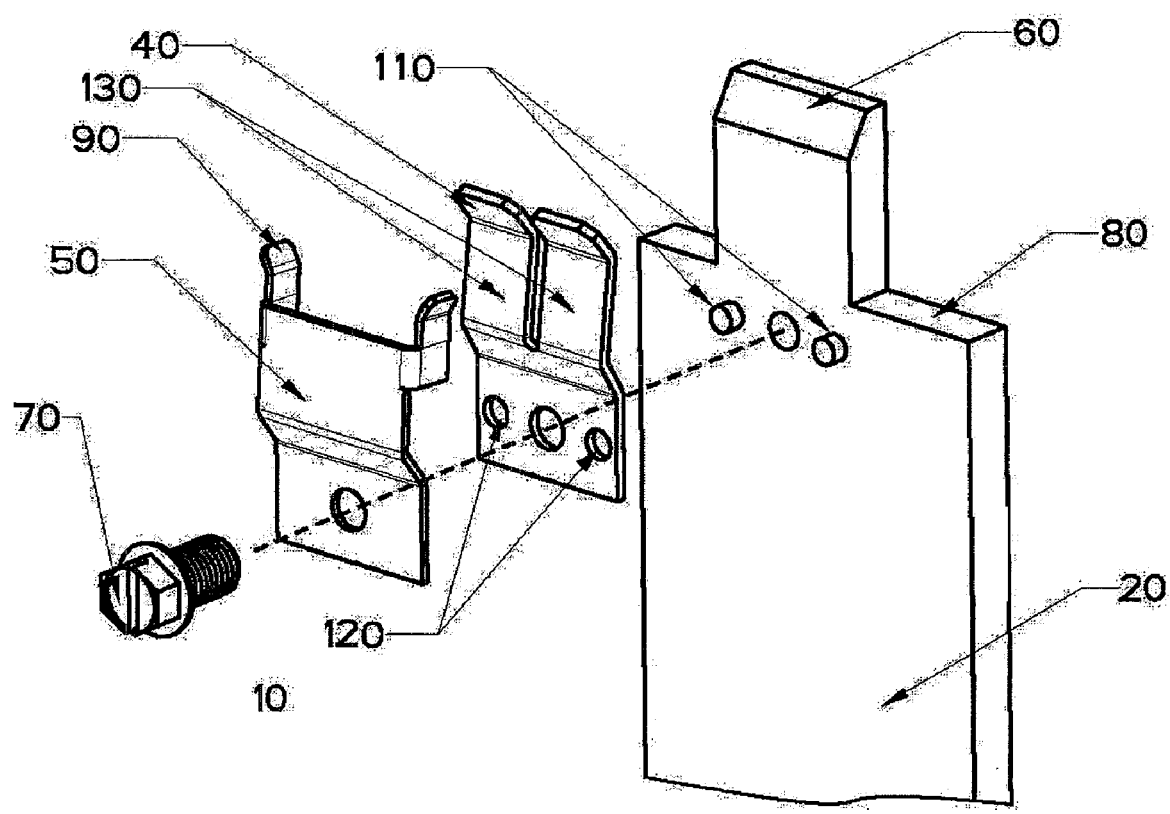
FIG. 5 is an exploded perspective view of a meter socket assembly.

Referring to FIG. 5, extended bus bar 20 includes at least one shear guide 110 to locate and mate with the locating feature 120 on meter jaw 40. Meter jaw 40 includes at least one locating feature 120 to mate with the shear guide 110 and to locate and align both the extended bus bar 20 and the meter jaw 40 to one another. In this embodiment, meter jaw 40 is split cut in the middle to create (at least) two separated jaw fingers 130. The separated jaw fingers 130 independently respond to the insertion of the meter blade and are able to absorb any slight misalignment of the meter blade along the insertion space between the meter jaw 40 and the extended bus bar 20. Others skilled in the art may select to not split meter jaw 40 into separated jaw fingers 130. Others skilled in the art may select to use a plurality separated jaw fingers 130.

Figure 6:
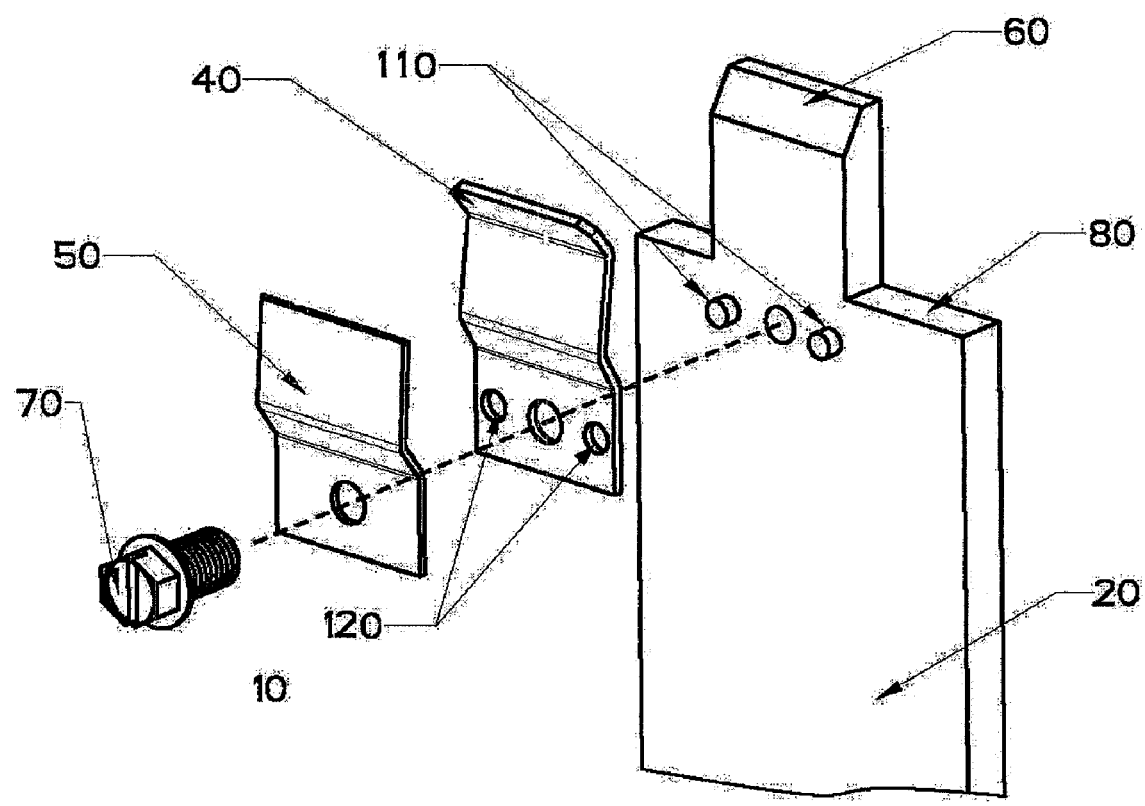
FIG. 6 is an exploded perspective view of an alternate embodiment of a meter socket assembly.

FIG. 6 shows an alternative embodiment of the meter jaw assembly 10. In this embodiment, meter jaw 40 shows no split down the middle to create separated jaw fingers 130. Similarly, FIG. 6 does not include arm guide 90 or locating features 120 on the jaw spring guide 50.

Figure 7:
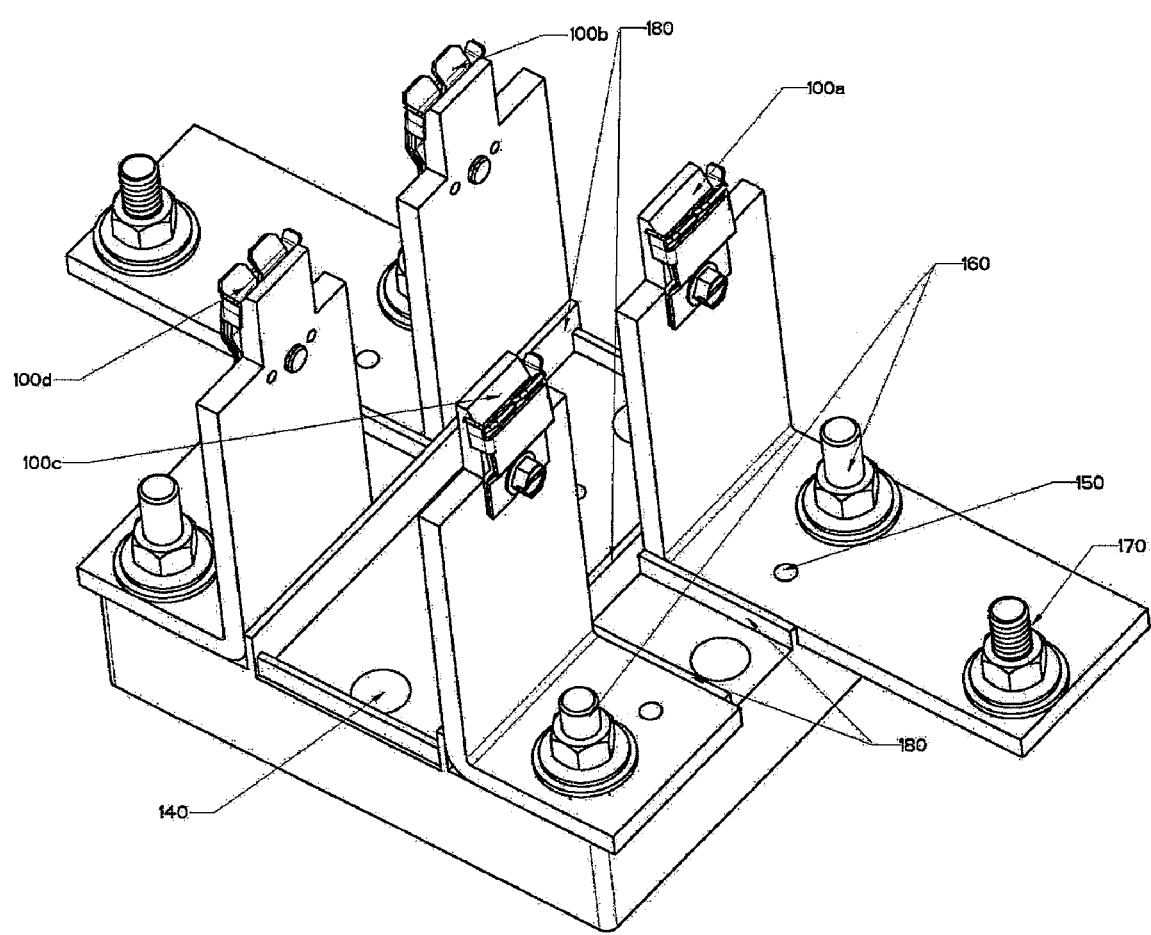
FIG. 7 is a perspective view of a plurality of meter socket assemblies sitting in a basepan.

FIG. 7 shows a plurality of meter socket assemblies 100 a-d mounted in a molded base pan 140. The plurality of meter socket assemblies 100 a-d are mounted to molded base pan 140 using attachment devices 150 and 160. In the preferred embodiment, attachment devices 150 and 160 are a screw or rivet and bolt respectively. Attachment device 160 is threaded into the extended bus bar 20 and secures the extended bus bar 20 to molded base pan 140. Those skilled in the art may use an insulating material to construct molded base pan 140 where insulating materials may include plastic, porcelain or ceramic. Attachment device 160 also includes the standard nut and flat washers which are prepared for additional bus connections. Secondary attachment device 170 is a square or ribbed neck bolt that prevents the bolt from turning or falling out when the nut is tightened. Attachment device 170 also uses standard nut with spring washer and flat washer that are prepared for additional bus connections. The ribs 180 on molded base pan 140 locate the plurality of meter socket assemblies 100 a-d on assembly and as a result help guide the alignments for the meter blade insertion into the meter jaw 40 portions of the meter socket assemblies. The meter socket guide 210 (shown in FIG. 8) also aligns the meter socket assemblies 100 a-d on assembly. The meter socket guide 210 snaps between the meter socket assemblies 100 a-d on the cut out portion 80 against the inside of the extended bus bar 20. The meter socket guide 210 ensures the horizontal and vertical alignments of the respective meter jaw 40 of the meter socket assemblies 100 a-d to provide precise fitting to watt-hour meter blades. Improved alignment of meter jaw 40 will allow easier insertion and extraction of the meter blade of the watt-hour meter and as a result improves the connection contact between meter jaw 40 and the meter blade. As a result of improved alignment, the connection contact will develop less heat under current load as the extended bus bar 20 will act as a heat sink and reduce heat from the connection contact. The molded base pan 140 has four mounting provisions to secure the plurality of meter socket assemblies 100 a-d and two mounting provisions 220 (see FIG. 8) to secure meter cover housing 190.

Figure 8:
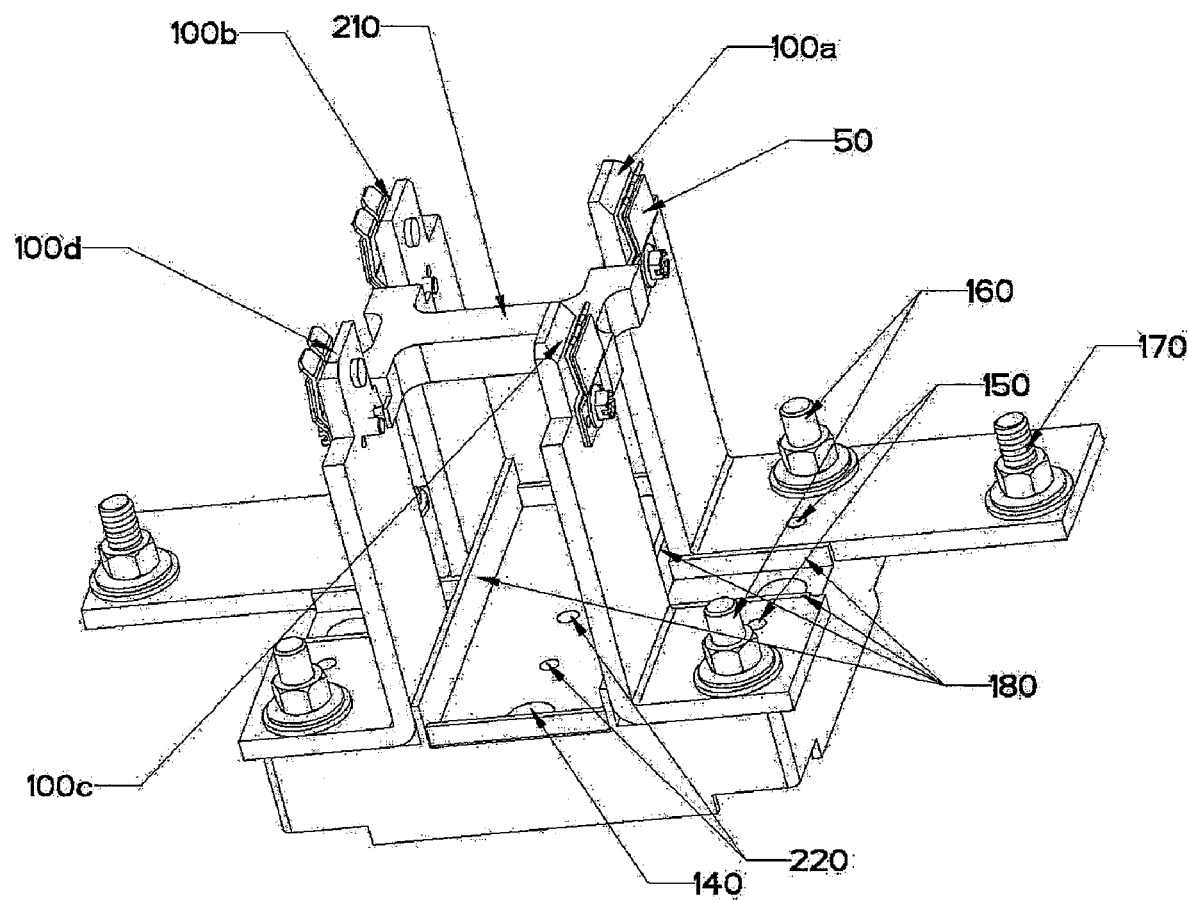
FIG. 8 is a perspective view of a plurality an alternate type meter socket assemblies sitting in a basepan.

FIG. 8 shows a plurality of ringless type meter socket assemblies 100 a-d mounted into molded base pan 140 as described in FIG. 7. In this embodiment the jaw spring guide 50 does not include arm guide 90. With the mater socket guide 210, the plurality of meter socket assemblies 100 a-d are aligned horizontally and vertically.

Figure 9:
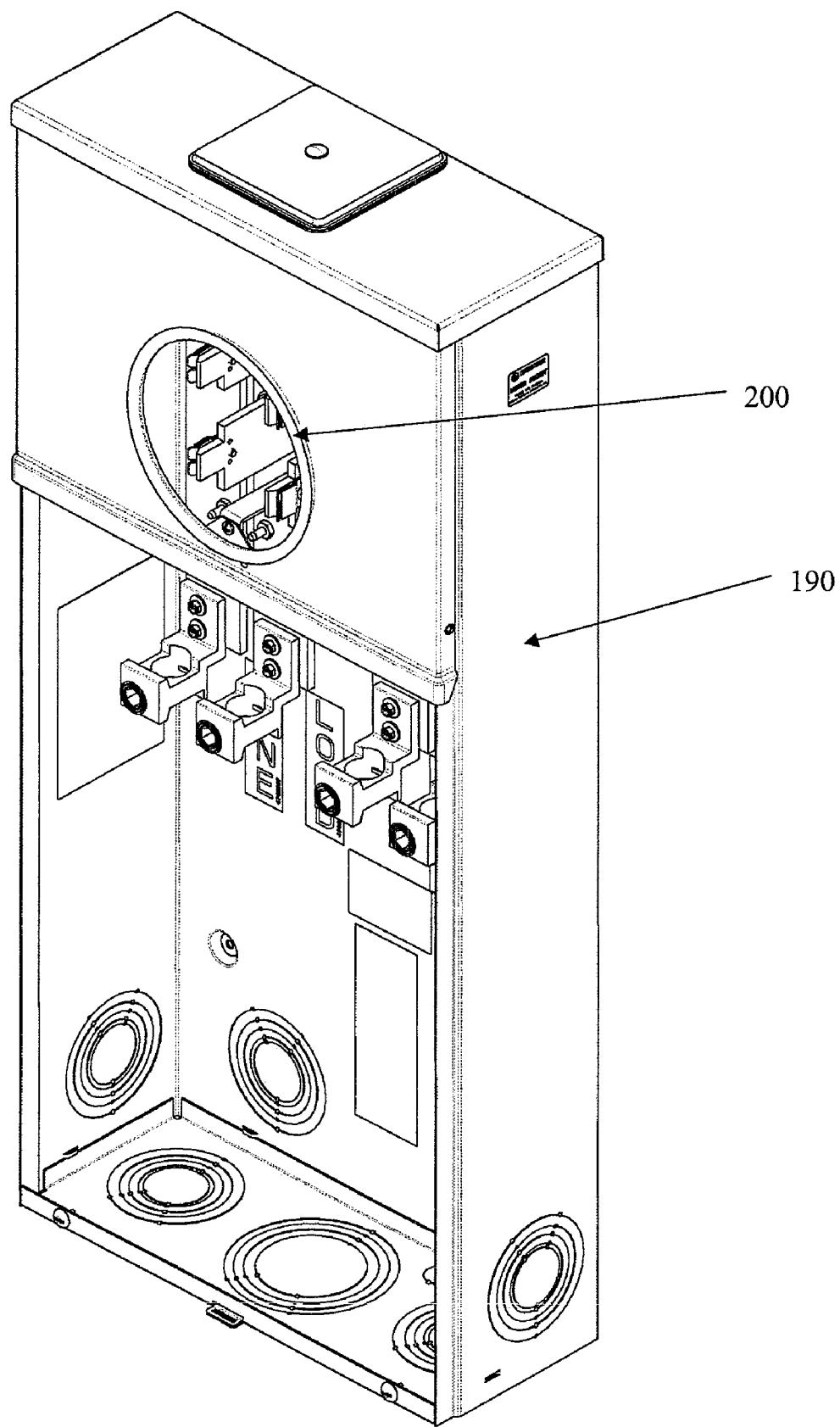
FIG. 9 is a perspective view of a plurality of meter socket assemblies seated in a meter box enclosure housing.

Referring to FIG. 9, meter cover housing 190 includes an opening 200 in the front wall of meter cover housing 190. The meter cover 190 comprises a plurality of walls wherein an inner surface of back wall of meter cover housing 190 contains a plurality of meter socket assemblies 100-a-d. The meter socket assemblies 100 a-d in its entirety is secured to the back wall of housing 190 through the four mounting provisions 220 on the molded base pan 140 (see FIG. 8).

While the foregoing description and drawings represent the preferred embodiments of the present invention, it will be apparent to those skilled in the art that various changes and modifications may be made therein without departing from the true spirit and scope of the present invention.

The invention claimed is:

1. A meter socket assembly for an electrical meter box comprising:
    an extended bus bar of generally L-shape, the bus bar having first and second ends, the first end being constructed and arranged to be coupled with a base associated with the meter box;
    a meter jaw assembly with a meter jaw for securing and contacting a meter blade of a watt hour meter with the second end of the extended bus bar; and
    a fastening device for mounting the meter jaw assembly to the extended bus bar,
    the meter socket assembly being in combination with three additional meter socket assemblies defining two pairs of meter socket assemblies disposed in spaced relation, wherein each extended bus bar has a surface defining a cutout portion, and wherein a single meter socket guide contacts the surface defining the cutout portion of each extended bus bar to maintain spacing between the extended bus bars for ensuring alignment of each meter jaw with an associated blade of a watt-hour meter.

2. The combination of claim 1, wherein the meter jaw has a joggled bend.

3. The combination of claim 1, wherein the meter jaw has a plurality of separated fingers to contact the meter blade.

4. The combination of claim 1, wherein the meter jaw has at least one fastening opening to mate with the fastening device.

5. The combination of claim 1, wherein the meter jaw assembly comprises a jaw spring guide for overlying the meter jaw.

6. The combination of claim 5, wherein the jaw spring guide comprises at least one arm guide for securing the meter blade of the watt hour meter.

7. The combination of claim 5, wherein the jaw spring guide provides a spring bias force to contact the meter blade with the meter jaw and the extended bus bar.

8. The combination of claim 5, wherein the jaw spring guide comprises at least one fastening opening to mate with the fastening device.

9. The combination of claim 1, wherein the second end of the extended bus bar has a chamfered receptacle terminal for receiving the meter blade.

10. The combination of claim 1, wherein the extended bus bar comprises at least one fastening opening to mate with the fastening device.

11. The combination of claim 1, in further combination with the base in the form of a base pan, the first end of the extended bus bar being coupled to the base pan via an attachment device.

12. The combination of claim 11, wherein the attachment device is one of a screw, a rivet or a bolt.

13. A meter socket enclosure assembly comprising:
    a housing comprising a plurality of walls wherein a front wall includes an opening for mounting a watt hour meter;
    a base pan mounted to an inner surface of a back wall of the housing, and four meter socket assemblies mounted to the base pan, each meter socket assembly comprising:
        an extended bus bar, the bus bar having first and second ends, the first end being coupled with the base pan;
        a meter jaw adjacent to a surface of the second of the extended bus bar for securing and contacting a meter blade of a watt hour meter between the meter jaw and surface of the second end of the extended bus bar; and
        a fastening device for mounting the meter jaw assembly to the extended bus bar,
    wherein the meter socket assemblies define two pairs of meter socket assemblies disposed in spaced relation, wherein each extended bus bar has a surface defining a cutout portion, and wherein a single meter socket guide contacts the surface defining the cutout portion of each extended bus bar to maintain spacing between the extended bus bars for ensuring alignment of each meter jaw with an associated blade of a watt-hour meter.

14. The enclosure of claim 13, wherein each meter socket assembly includes an extended bus bar having an end coupled to the base pan via an attachment device.

15. The enclosure of claim 14, wherein the attachment device is one of a screw, a rivet or a bolt.

16. The enclosure of claim 14, wherein each extended bus bar is of generally L-shape.

17. A method to limit heat rise in a meter socket assembly of an electrical meter box comprising the steps of:
    providing four extended bus bars defining two pairs of extended bus bars, each bus bar being of generally L-shape and having first and second ends, the first end being constructed and arranged to be coupled with a base associated with the meter box; each extended bus bar having a surface defining a cutout portion,
    providing a meter jaw assembly having a meter jaw adjacent to the second end of each extended bus bar;
    contacting a single meter socket guide with the surface defining the cutout portion of each extended bus bar to maintain spacing between the extended bus bars for ensuring alignment of each meter jaw with an associated blade of a watt-hour meter, and
    contacting a meter blade of a watt hour meter between each extended bus bar and the associated meter jaw with the bus bar acting as a heat sink transferring heat generated at the first end of the bus bar towards the second end thereof.

18. The method of claim 17, wherein the meter jaw has a joggled bend.

19. The method of claim 17, wherein the meter jaw has a plurality of separated fingers to contact the meter blade.

20. The method of claim 17, wherein the meter jaw is coupled via a fastening device with the extended bus bar.

21. The method of claim 17, wherein the meter jaw assembly comprises a jaw spring guide for overlying the meter jaw.

22. The method of claim 21, wherein the jaw spring guide comprises at least one arm guide for securing the meter blade of the watt hour meter.

23. The method of claim 21, wherein the jaw spring guide provides a spring bias force to contact the meter blade with the meter jaw and the extended bus bar.

24. The method of claim 21, wherein the jaw spring guide comprises at least one fastening opening to couple with the meter jaw and the extended bus bar.

25. The method of claim 21, wherein the extended bus bar comprises at least one fastening opening to couple with the meter jaw and the jaw spring guide.

26. The method of claim 17, wherein the extended bus bar has a chamfered receptacle terminal for receiving the meter blade.

* * * * *